(12) United States Patent
Pacheco et al.

(10) Patent No.: US 11,346,818 B2
(45) Date of Patent: May 31, 2022

(54) METHOD, DEVICE AND SYSTEM FOR NON-DESTRUCTIVE DETECTION OF DEFECTS IN A SEMICONDUCTOR DIE

(71) Applicant: Intel Corporation, Santa Clara, CA (US)

(72) Inventors: Mario Pacheco, Tempe, AZ (US); Odissei Touzanov, Chandler, AZ (US); Jacob Woolsey, Mesa, AZ (US); Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 155 days.

(21) Appl. No.: 16/881,025

(22) Filed: May 22, 2020

(65) Prior Publication Data

US 2021/0364474 A1    Nov. 25, 2021

(51) Int. Cl.
  *G01R 31/28* (2006.01)
  *G01N 29/22* (2006.01)
  *G01N 29/04* (2006.01)

(52) U.S. Cl.
  CPC ......... *G01N 29/225* (2013.01); *G01N 29/043* (2013.01); *G01R 31/2889* (2013.01); *G01R 31/2891* (2013.01); *G01N 2291/2697* (2013.01)

(58) Field of Classification Search
  CPC .. G01R 1/0416; G01R 1/067; G01R 1/06711; G01R 1/06744; G01R 1/06772; G01R 1/071; G01R 1/07342; G01R 3/00; G01R 15/241; G01R 31/2601; G01R 31/2886; G01R 31/308; G01R 31/311
  See application file for complete search history.

(56) References Cited

U.S. PATENT DOCUMENTS 5,196,786 A * 3/1993 Usami ................. G01R 31/308
                                                  324/642
5,576,831 A * 11/1996 Nikoonahad ...... G01N 21/9501
                                                  250/559.27
5,760,597 A * 6/1998 Yoshida ............. G01R 31/2656
                                                  257/E21.531

* cited by examiner

*Primary Examiner* — Tung X Nguyen
(74) *Attorney, Agent, or Firm* — Viering, Jentschura & Partner MBB

(57) ABSTRACT

According to various examples, a method for non-destructive detection of defects in a semiconductor die is described. The method may include positioning an emitter above the semiconductor die. The method may include generating an emitted wave using the emitter that is directed to a focal point on a surface of the die. The method may include generating a reflected wave from the focal point. The focal point may act as a point source reflecting the emitted wave. The method may include positioning a receiver above the die to receive the reflected wave. The method may also include measuring the reflected wave to detect modulations in amplitude in the reflected wave.

18 Claims, 7 Drawing Sheets

METHOD, DEVICE AND SYSTEM FOR NON-DESTRUCTIVE DETECTION OF DEFECTS IN A SEMICONDUCTOR DIE

BACKGROUND

Fast and reliable inspection technology is essential for improving yield and productivity in semiconductor manufacture. Internal cracks along the edges and surfaces of a semiconductor die, and for wafers, may occur during conventional manufacturing process steps, such as laser scribing, saw dicing, pick-and-place die singulation, package assembly or even reliability testing. Detection and monitoring of such internal defects are very important for properly adjusting the process steps that could potentially initiate and propagate die-edge and surface defects.

A current approach to achieve non-destructive detection of defects in a semiconductor wafer or die includes using infrared imaging techniques. However, a metallization layer is often placed on the backside of the semiconductor wafer or die to improve thermal dissipation performance. When a metallization layer is added on the backside of the semiconductor wafer or die, near-infrared (NIR) detection methods, e.g., near-infrared laser scanning confocal microscopy cannot be used because NIR light cannot pass through metallization layers.

Another approach to defect detection for semiconductor wafers and dies is to use a conventional scanning acoustic microscope (SAM) that employs a single acoustic transducer acting as an emitter and receiver. However, conventional SAM cannot conclusively detect internal die cracks because such defects do not typically produce a sufficient acoustic impedance mismatch to cause a reflection that would be detectable by the same single transducer.

Other possible alternatives include removing the metallization layer to enable NIR inspection and performing a focused ion beam (FIB) cross-sectioning technique. However, these methods are destructive and time-consuming, requiring more than 24 hours of time-to-data per sample. In addition, destructive defect detection alternatives may often require the scrapping of the full wafer being inspected due to non-plan of record (POR) handling and/or foreign material introduction. Such destructive alternatives may also create die cracking/chipping as artifacts of the techniques.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
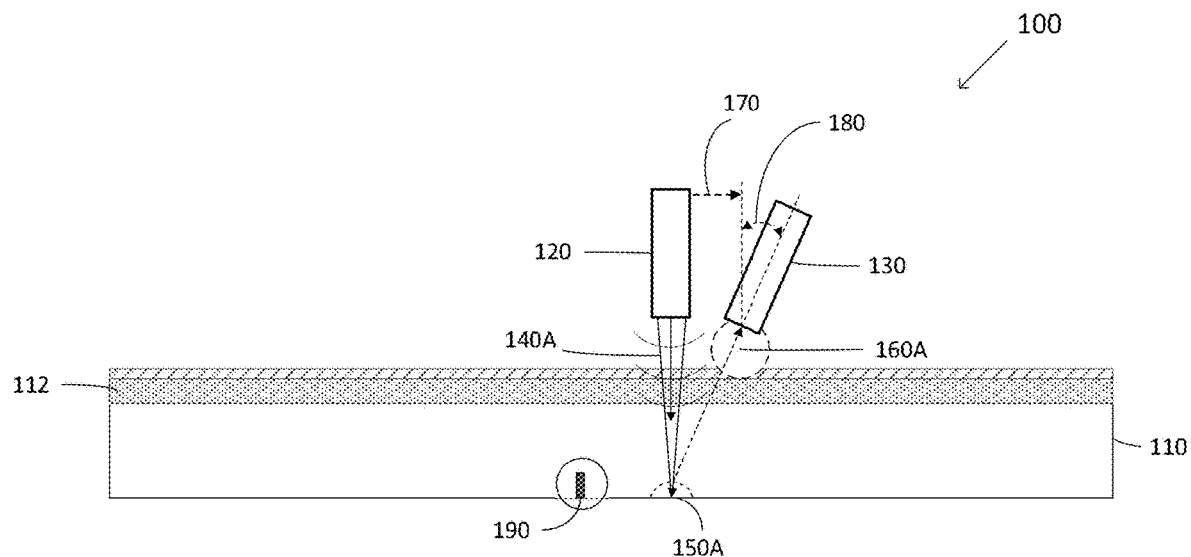
FIG. 1A shows a cross-sectional view of a device for non-destructive detection of defects in a semiconductor die according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for systems, various aspects are provided for devices, and various aspects are provided for methods. It will be understood that the basic properties of the systems and/or devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

A potential advantage of the present disclosure may include non-destructive detection of internal cracks in semiconductor dies, wafers, bare diced semiconductor dies, and packaged dies that may have backside metallization. The various aspects of the present devices, methods and systems are directed to the non-destructive detection of internal cracks.

The technical effects of the present disclosure may include, for example, a decrease in the number of occurrences of defective dies used in a final product, decreasing the time required to screen for defects, and avoiding the need to destroy dies or wafers when screening for defects.

The present disclosure generally relates to a method for non-destructive detection of defects in a semiconductor die. The method may include positioning an emitter above the semiconductor die and generating an emitted wave using the emitter that is directed to a focal point on a surface of the die. The method may include generating a reflected wave from the focal point, which acts as a point source reflecting the emitted wave. The method may include positioning a receiver above the die to receive the reflected wave. The method may also include measuring the reflected wave to detect modulations in the amplitude of the reflected wave that may be caused by a defect in the surface of the die.

The present disclosure generally further relates to a device for detecting defects in a semiconductor die. The device may include an emitter positioned above the die. The emitter may be configured to generate an emitted wave that is directed to a focal point on a surface of the die to generate a reflected wave. The focal point may act as a point source reflecting the emitted wave. The device may include a receiver that may be paired with the emitter and positioned above the die. The receiver may be positioned set apart from the emitter to receive the reflected wave. The device may be configured to measure the reflected wave to detect modulations in the amplitude of the reflected wave.

To more readily understand and put into practical effect the present semiconductor package, particular aspects will now be described by way of examples and not limitations, and with reference to the figures. For the sake of brevity, duplicate descriptions of features and properties may be omitted.

FIG. 1A shows a cross-sectional view of a schematic of a device 100 for non-destructive detection of defects in a semiconductor die 110. In the aspect shown in FIG. 1A, a device 100 may include an emitter 120, and a receiver 130. In various aspects according to the present disclosure, the emitter 120 may be an acoustic emitter, or a pressure emitter. In other aspects, the receiver 130 may be an acoustic receiver, a vibration probe, a pressure sensor, or an optical receiver. The device 100 may be used for detecting a defect 190 on the semiconductor die 110.

According to the present disclosure, the semiconductor die 110 may be made from any suitable semiconductor, such as, for example, silicon or gallium arsenide. In an aspect, the semiconductor die 110 may have a thickness range of approximately 50 μm to 800 μm.

In an aspect, the device 100 may detect the defect 190 located on a top surface or near an edge of the semiconductor die 110. For example, according to the various aspects of the present disclosure, the defect may be a three-dimensional defect, an internal crack, a vertical crack, or a horizontal crack.

In an aspect, the device 100 may be used to detect defects in the semiconductor die 110 that may have backside metallization 112. The backside metallization 112 may be a metal layer added on the backside of the semiconductor die 110 to improve the thermal dissipation performance of the semiconductor die 110. A thickness range of the backside metallization layer 112 may be approximately 0.5 μm to 1 μm. The backside metallization layer 112 may be made out of any suitable metal, for example, copper, gold, or silver.

Also, as shown in FIG. 1A, the semiconductor die 110 may be immersed in a liquid medium, e.g., water. Water is a readily available and usable liquid medium that may be used for enhancing the propagation of the emitted waves and the reflected waves. An exemplary use of water is further discussed with respect to FIG. 3 below.

In the aspect shown in FIG. 1A, the emitter 120 may be arranged to be positioned above the semiconductor die 110. The emitter 120 may be configured to generate an emitted wave 140A that may be directed to a focal point 150A on the semiconductor die 110. In an aspect, the emitted wave 140A may be an acoustic wave, e.g., an ultrasound wave. The emitter may have acoustic lens to focus the emitted wave 140A towards the bottom surface of the semiconductor die 110.

In an aspect, the emitter 120 may direct the emitted wave 140A into the semiconductor die 110 from the backside metallization 112 side at the top surface of the semiconductor die 110. The emitted wave 140A may travel through the semiconductor die 110 to reach the bottom of the semiconductor die 110. The bottom of the semiconductor die 110 may reflect the emitted wave 140A back to the backside metallization 112 side of the semiconductor die 110. In some aspects, the semiconductor die may include at least one frontside metal layer. The at least one frontside metal layer may be integrated circuits, which may include billions of transistors. Defects may be commonly found in and near the at least one frontside metal layer. The emitted wave 140A may travel through the semiconductor die 110 to reach frontside metal layers located at the bottom of the semiconductor die 110. The frontside metal layers may reflect the emitted wave 140A back to the backside metallization 112 side of the semiconductor die 110.

In another aspect, the focal point 150A may act as a point source reflecting the emitted wave 140A. The emitted wave 140A directed to the focal point 150A may generate a reflected wave 160A (shown as a dashed line) from the focal point 150A. The focal point 150A may be a point on or near any surface or edge of the semiconductor die 110.

In some aspects, the focal point 150A may be a circular area of approximately 50 μm. According to the present disclosure, the diameter of the circular area may have a range of approximately 20 to 60 μm. The shape of the focal point can vary depending on the acoustic lens used with the emitter, i.e., oval etc.

Figure 1B:
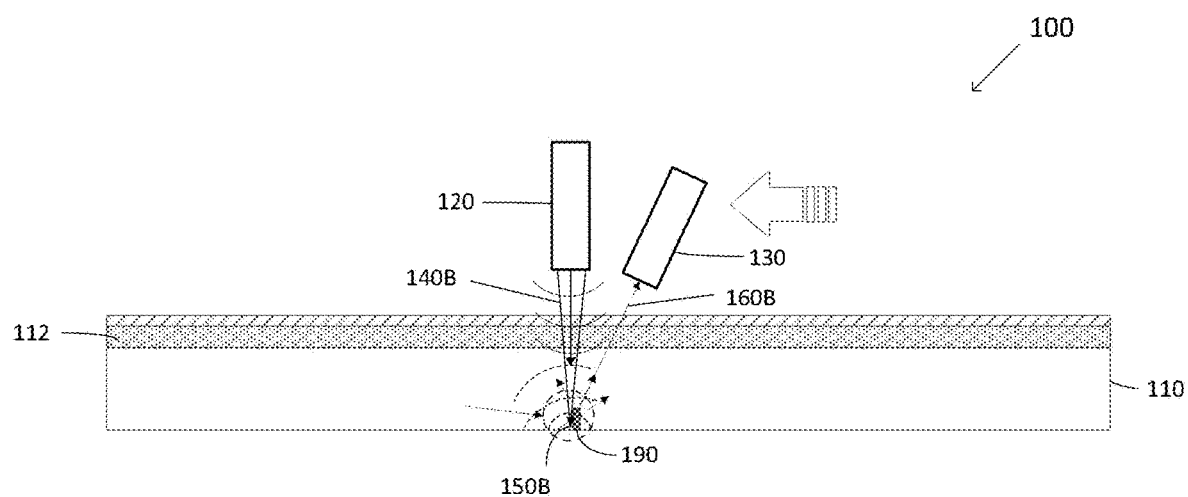
FIG. 1B shows the device of FIG. 1A detecting defects in a semiconductor die according to an aspect of the present disclosure.

In an aspect, the emitted wave 140A may be directed at a specified angle of incidence towards the focal point 150A. According to the present disclosure, the specified angle of incidence may have a range of approximately 10 to 90 degrees. As shown in FIGS. 1A and 1B, the exemplary angle of incidence may be approximately 90 degrees.

The emitter 120 may be arranged to be at least partially immersed in the liquid medium. In an aspect, only a portion of the emitter 120 that emits the emitted wave 140A may be immersed in the liquid medium. In another aspect, the entire emitter 120 may be immersed in the liquid medium.

In an aspect, the emitter 120 may emit the emitted wave 140A at a frequency range of approximately 50 kHz to 200 MHz. The frequency of the emitted wave 140A may be chosen based on whether the emitter 120 is used in a liquid medium or air medium. The frequency of the emitted wave 140A may also be chosen based on the type of receiver 140 paired with the emitter. As an example, when receiver 140 is a vibration probe, the frequency range of the emitted wave 140A may be approximately 50 kHz and 1 MHz. As another example, when the emitter 120 is in a liquid medium and the receiver is an acoustic receiver, the frequency range of the emitted wave 140A may be approximately 10 MHz and 200 MHz.

In the aspect shown in FIG. 1A, the receiver 130 may be arranged to be positioned above the semiconductor die 110. The receiver 130 may be arranged to receive the reflected wave 160A and may be at least partially immersed in a liquid medium. In an aspect, only a portion of the receiver 130 that receives the reflected wave 160A may be immersed in the liquid medium. In another aspect, the entirety of the receiver 130 may be immersed in the liquid medium.

In an aspect, the receiver 130 may be tilted at an angular offset 180, as shown in FIG. 1A, relative to the positioning of the emitter 120. The receiver 130 may be tilted to receive the reflected wave 160A for optimum signal detection to increase sensitivity due to the directivity of the wavefront in liquid. According to the present disclosure, the angular offset 180 may have a tilt angle in the range of approximately 10 to 80 degrees. As shown in FIG. 1A, the exemplary tilt angle may be approximately 25 degrees.

In another aspect, the receiver 130 may be positioned set apart from the emitter 120. The emitter 120 and the receiver 130 may have an offset 170, as shown in FIG. 1A, between them. The term "offset" herein may be understood as a difference in position, without needing the emitter or the receiver to be in any fixed position. The term "offset" herein may also cover the emitter 120 and the receiver 130 being in the same housing but having a difference in position between the part of the emitter 120 which emits the emitted wave 140A, and the part of the receiver 130 which receives the reflected wave 160A. As shown in FIG. 1A, the exemplary offset may be approximately 550 um.

In various aspects, the device 100 may be configured to measure the reflected wave 160A to detect modulations in the amplitude of the reflected wave 160A. In an aspect, when a defect occurs at the focal point 150A, the emitted wave 140A directed to the focal point 150A may generate a reflected wave 160A, which is scattered in a plurality of directions. This scattering may alter the acoustic wavefront by introducing stronger amplitudes along the X-axis and a decrease in pressure along the Y-axis. This amplification of the oscillation amplitude in the reflected wave 160A along the X-axis may be received by the receiver 130.

In an aspect shown in FIG. 1B, the positioning of the emitter 120 may be changed while inspecting a semiconductor die or wafer. The emitter 120 may generate additional emitted waves 140B. In an aspect, the focal point 150 may include a series of focal points 150A (not shown), as it moves along the surface (i.e., scanning) to focal point 150B on the semiconductor die 110. The series of focal points 150A may act as a series of point sources reflecting a series of emitted waves 140A. According to the present disclosure, at focal point 150B shown in FIG. 1B, the additional emitted waves 140B generate additional reflected waves 160B (shown as a dashed line). In this aspect, the device 100 may measure the additional reflected waves 160B to detect modulations in the amplitude of the additional reflected waves 160B.

In an aspect shown in FIG. 1A, since the focal point 150A does not have a defect, the emitted wave 140A that is directed to the focal point 150A may generate the reflected wave 160A, which may not have scattering effects. The device 100 may determine from the amplitude of the reflected wave 160A that there is no defect on the surface of the semiconductor die 110 at the focal point 150; this may act as a "baseline" value.

In contrast, as shown in FIG. 1B, since the focal point 150B has a defect, the additional emitted wave 140B directed to the focal point 150 may generate the additional reflected wave 160B, which may be reflected/scattered in a plurality of directions. The device 100 may determine from the amplitude of the additional reflected wave 160B that there is a defect on the surface of the semiconductor die at the focal point 150B.

In an aspect, the number of additional emitted waves may be any suitable integer n. The number of focal points may also be any suitable integer n. In addition, the number of additional reflected waves may also be any suitable integer n. In an aspect, the number of suitable integer n may be chosen based on a number of focal points sufficient to cover the whole surface of the semiconductor die 110 or a set inspection protocol relating to a particular POR. In another aspect, the number of suitable integer n may be chosen based on a number of focal points sufficient to cover the perimeter/edges of the semiconductor die 110.

For the sake of brevity, duplicate descriptions of features and properties are omitted. It will be understood that any features and property described herein for the emitted wave 140A, the focal point 150A and the reflected wave 160A may apply to all additional emitted waves, all focal points, and all additional reflected waves.

Figure 2:
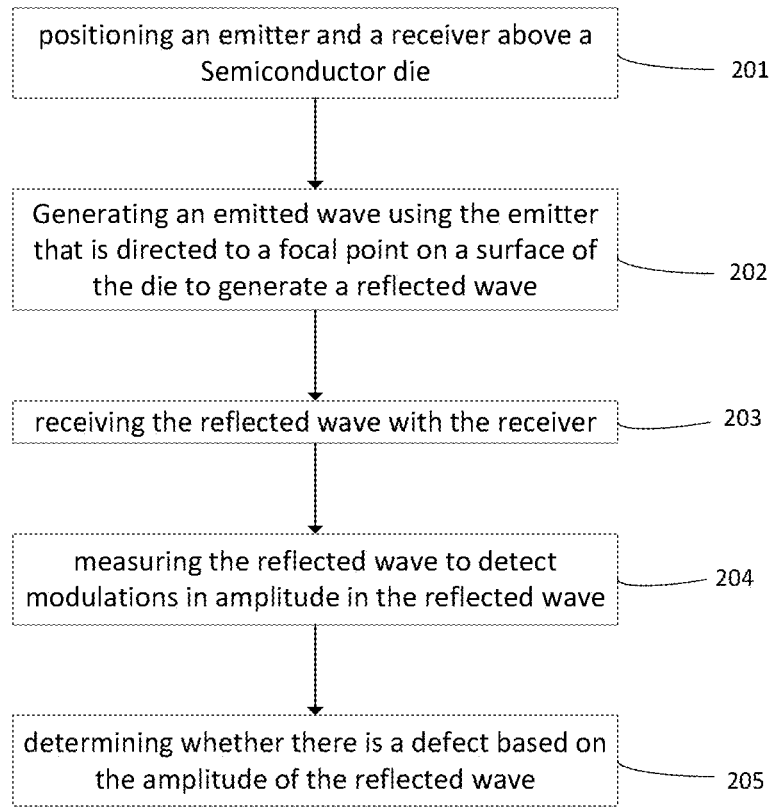
FIG. 2 shows a flow chart illustrating a method for non-destructive detection of defects in a semiconductor die according to an aspect of the present disclosure.

FIG. 2 shows a flow chart of a method for non-destructive detection of defects in a semiconductor die according to an aspect of the present disclosure. As shown in FIG. 2, in a first operation 201, an emitter and a receiver may be positioned above a semiconductor die. In a second operation 202, the emitter may generate an emitted wave that is directed to a focal point on a bottom surface of the die to generate a reflected wave from the focal point, wherein the focal point acts as a point source reflecting the emitted wave. In a third operation 203, the receiver may receive the reflected wave. In a fourth operation 204, the reflected wave may be measured to detect modulations in the amplitude of the reflected wave. In a fifth operation 205, based on the amplitude of the reflected wave, determining whether there is a defect from the measurements.

It will be understood that the above operations described above relating to FIG. 2 are not limited to this particular order. Any suitable, modified order of operations may be used.

Figure 3:
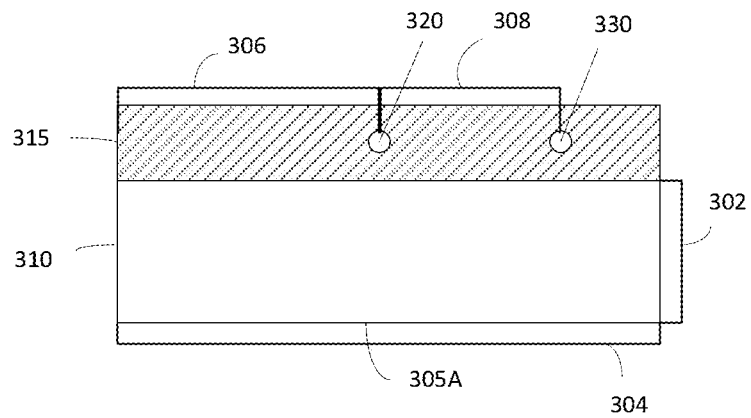
FIG. 3 shows side view of a schematic of an exemplary position and dimensions of an emitter and receiver with respect to the semiconductor die according to an aspect of the present disclosure.

FIG. 3 shows a side view of a schematic of an exemplary position and dimensions of an emitter and receiver with respect to a semiconductor die 310 according to an aspect of the present disclosure.

As shown in FIG. 3, the semiconductor die 310 may have a thickness 302. The thickness 302 may be approximately 800 um. The semiconductor die 310 may have a length 304, which may be approximately 3 mm. The semiconductor die 310 may be immersed in a liquid medium 315. An emitter 320 may be positioned above the semiconductor die 310. The emitter 320 may be at least partially immersed in the liquid medium 315. The emitter 320 may be positioned approximately 0.2 mm above the semiconductor die 310. The emitter 320 may be positioned above a focal point 350. The position of the emitter 320 may change as the position of the focal point 350 changes. The receiver 330 may be positioned above the semiconductor die 310. The receiver 330 may be at least partially immersed in the liquid medium 315. The receiver 330 may be positioned approximately 0.2 mm above the semiconductor die 310. The receiver 330 may be positioned set apart from the emitter 320. The difference in position between the emitter 320 and the receiver 330, i.e., the offset, may be approximately 1 mm.

Figure 4A:
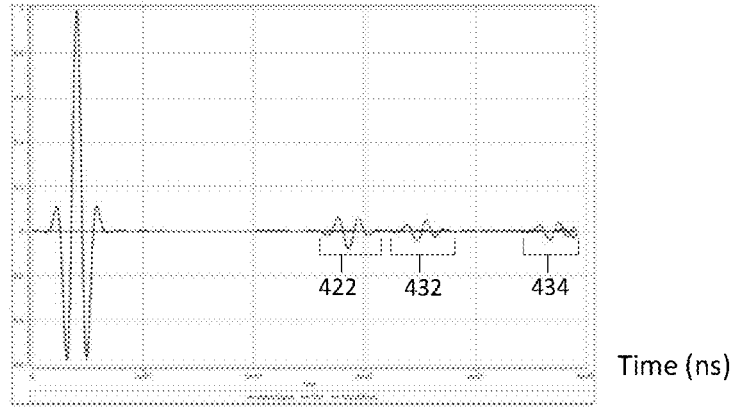
FIG. 4A shows a graph of a detected signal over time at a device when no defect is present according to an aspect of the present disclosure.
Figure 4B:
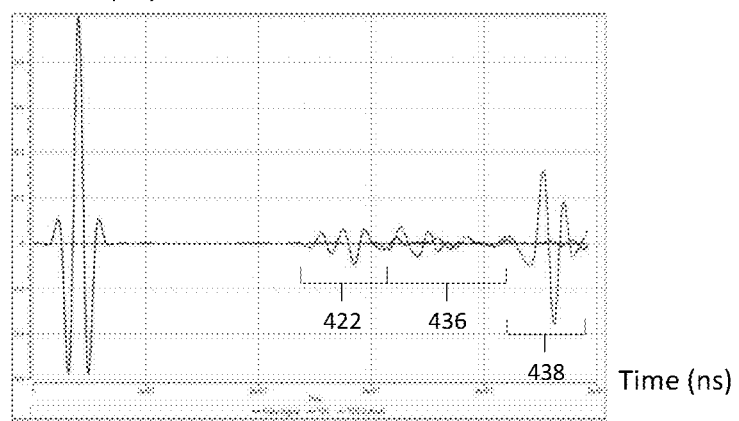
FIG. 4B shows a graph of a detected signal over time at a device when a defect is present according to an aspect of the present disclosure.

For the configuration shown in FIG. 3, the FIG. 4A shows a graph of a reflected wave signal measured over time by the receiver when no defect is present, according to an aspect of the present disclosure, and the FIG. 4B shows a graph of the reflected wave signal measured over time by the receiver when a defect is present, according to an aspect of the present disclosure. In FIG. 4A and FIG. 4B, the x-axis of the graphs represents time (ns) and the y-axis of the graphs represents decibels (dB). In FIGS. 4A and 4B, respectively, the large signal shown on the left side is the emitted wave from the emitter. In this aspect, the receiver may detect pressure waves as an amplitude oscillation. In comparing a part 432 of a reflected wave signal, as shown in FIG. 4A, with a part 436 of a reflected wave signal, as shown in FIG. 4B, when there is a defect, there may be the presence of a "tail" effect from scattering due to the defect shown in a first "echo" of the reflected wave signal.

Further comparing a part 434 of the reflected wave signal, as shown in FIG. 4A, with a part 438 of the reflected wave signal, as shown in FIG. 4B, there may be an amplification in the oscillation of the reflected wave signal. This difference in the signals of no-defect vs defect provides the basis for the present device to identify and "flag" the existence of a defect in a semiconductor die or wafer according to the present disclosure.

Figure 5A:
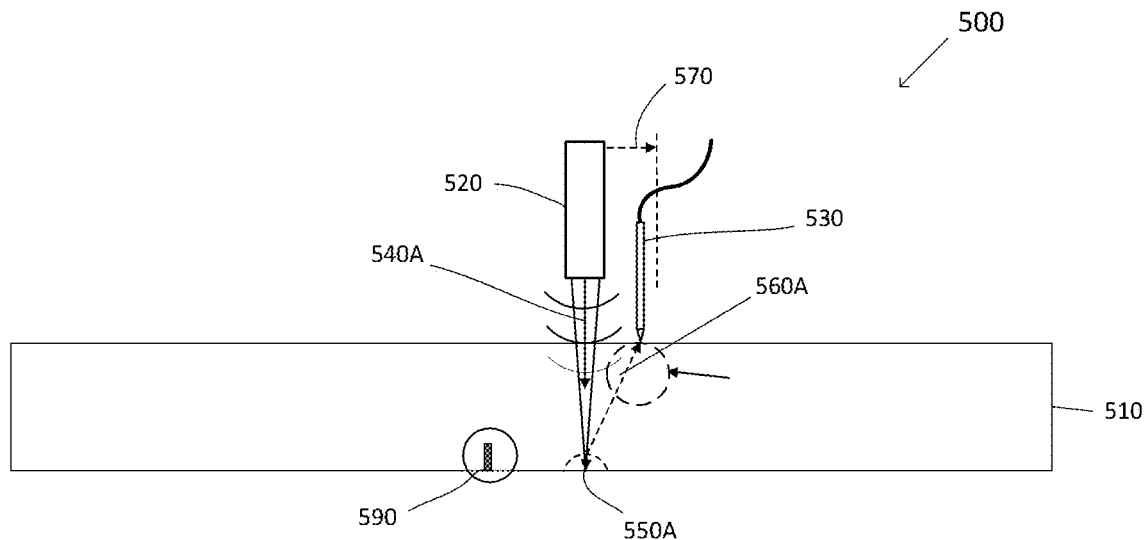
FIG. 5A shows a side view of a schematic of a device with an alternative receiver for non-destructive detection of defects in a semiconductor die at a first position according to an aspect of the present disclosure.
Figure 5B:
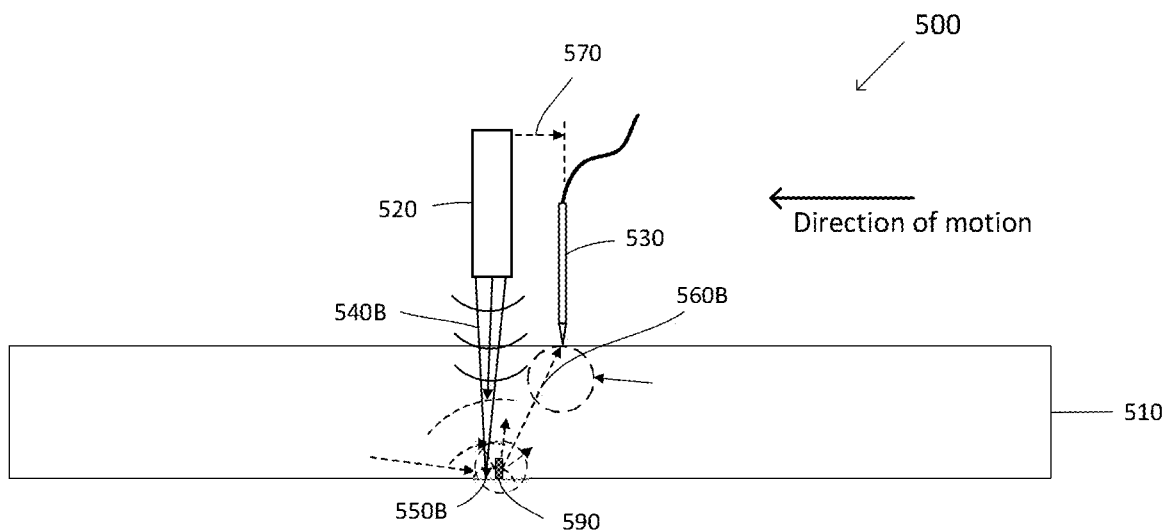
FIG. 5B shows a side view of a schematic of the device shown in FIG. 5A at a second position according to the aspect of the present disclosure.

FIGS. 5A and 5B show a side view of a schematic of a present device with an alternative receiver for the non-destructive detection of defects in a semiconductor die according to an aspect of the present disclosure. FIG. 5A shows a view of the present device at a first position of the semiconductor die, while FIG. 5B shows a view at a second position.

For the sake of brevity, duplicate descriptions of features and properties are omitted. It will be understood that the descriptions of any feature and/or property relating to FIG. 1A and FIG. 1B that are the same or similar to a feature and/or property in FIG. 5A and FIG. 5B will have those descriptions be applicable here as well.

In the aspect shown in FIG. 5A and FIG. 5B, a device 500 may include an emitter 520, and a fiber optic vibration probe or interferometer 530. The device 500 may be used for detecting a defect 590 on a semiconductor die 510. The device 500 may be used in an air medium or a liquid medium, and hence, the semiconductor die 510 may be tested in an air medium without needing to immerse the semiconductor die 510 in a liquid medium.

In this aspect, the emitter 520 may be arranged to be positioned above the semiconductor die 510. The emitter 520 may be configured to generate an emitted wave 540A that may be directed to a focal point 550A on the semiconductor die 510. The emitter 520 may be designed to transmit the emitted wave from its acoustic lens with high amplitude such that at least a portion of the wave penetrates and focuses at the bottom surface of the die 510. The focal point 550A may act as a point source reflecting the emitted wave 540A. The emitted wave 540A may be deemed to be generating a reflected wave 560A from the focal point 550A.

In a further aspect shown in FIG. 5A and FIG. 5B, the fiber optic vibration probe 530 may be arranged to be positioned above the semiconductor die 510. The fiber optic vibration probe or interferometer 530 may be arranged to receive the reflected wave 560A. The device 500 may be configured to measure the reflected wave 560A to detect modulations in the amplitude of the reflected wave 560A. In an aspect, when a defect occurs at the focal point 550A, the emitted wave 540A directed to the focal point 550A may generate a reflected wave 560A that may be scattered in a plurality of directions. This scattering may result in an amplification of the oscillation amplitude of the reflected wave 560A received by the vibration probe or interferometer 530.

In another aspect, the fiber optic vibration probe 530 may be positioned to focus at the backside of the die in the air medium to detect the reflected wave 560A as a vibrational signal before the reflected wave 560A may be attenuated by the change in propagating media created by the semiconductor die-air interface.

As shown in FIG. 5B, the fiber optic vibration probe 530 may be perpendicular to a top surface of the semiconductor die 510. When the reflected wave 560A reaches the surface of the semiconductor die 510, the surface of the semiconductor die may oscillate. The fiber optic vibration probe 510 may detect the emitter signal reflected back as the reflected wave 560A, which is a vibrational signal. The emitter signal may be an oscillating pressure wave that generates oscillations or vibrations in the die backside surface. The fiber optic vibration probe 510 may detect these oscillations or vibrations on the backside surface by emitting an electromagnetic wave that is directed to the backside surface and detecting the reflected electromagnetic waves. The reflected electromagnetic waves may be analyzed to obtain the parameters of the die backside oscillations.

In this aspect, the defect detection method may be similar to the one described in FIGS. 1A and 1B. By moving the acoustic emitter and the fiber optic receiver pair along the die surface or edge, the receiver detects a change in amplitude when the focal spot passes through a silicon defect. This device and method may be especially useful when scanning dies and wafers, where liquid immersion is inconvenient. In another aspect, dual fiber-optic receivers, i.e., detection probes, that are positioned perpendicularly to each other may be easily configured by using a fiber optic splitter such that the same instrumentation may read both fiber optic probes.

Figure 6A:
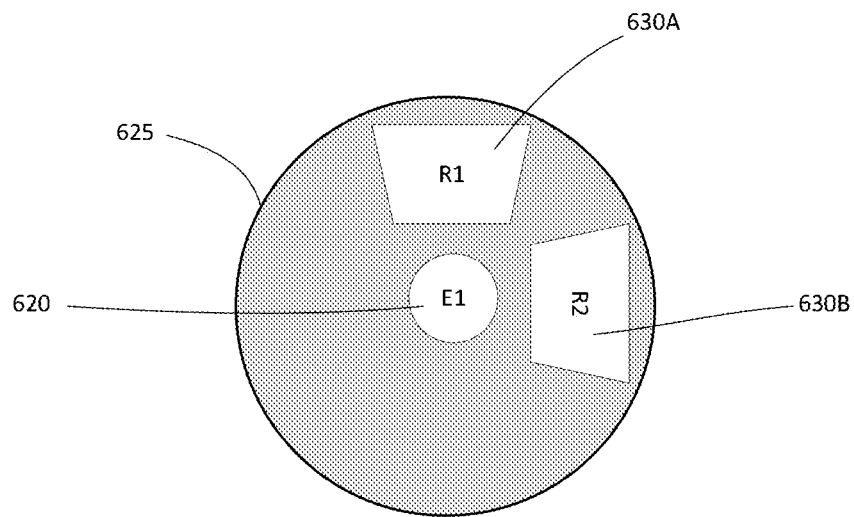
FIG. 6A shows a schematic for a device with an emitter and two receivers according to the aspect of the present disclosure.
Figure 6B:
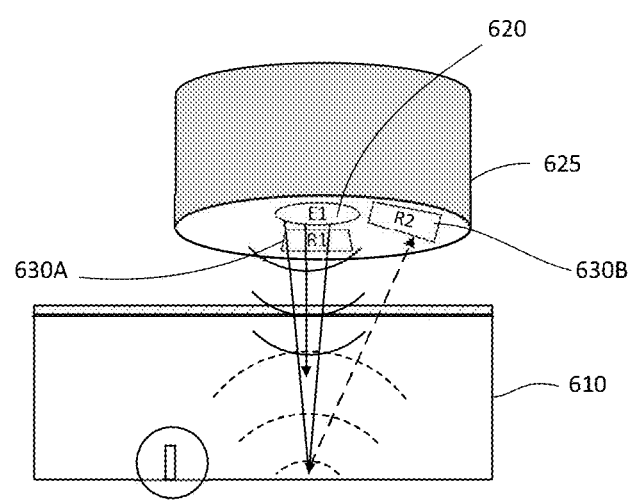
FIG. 6B shows a side view of a schematic of the device shown in FIG. 6A positioned for non-destructive detection of defects in a semiconductor die according to an aspect of the present disclosure.

FIG. 6A shows a schematic for a present device being a single transducer with an emitter and two receivers according to the aspect of the present disclosure. FIG. 6B shows a side view of a schematic of the device shown in FIG. 6A positioned for non-destructive detection of defects in a semiconductor die according to an aspect of the present disclosure For the sake of brevity, duplicate descriptions of features and properties are omitted. It will be understood that the descriptions of any feature and/or property relating to FIG. 1A, FIG. 1B, FIG. 5A and/or FIG. 45 that are the same or similar to a feature and/or property in FIGS. 6A and 6B will have those descriptions be applicable here as well.

In this aspect, as shown in FIGS. 6A and 6B, a single transducer 625 may have an emitter 620 and two receivers 630A and 630B. In other aspects, the single transducer 625 may have an emitter 620 and at least one receiver 630A. In various aspects, the emitter and/or receiver may be a piezoelectric element.

In some aspects, the single transducer 625 may have a central emitter 620 with two receivers 630A and 630B positioned on a circular periphery from the central emitter 620. The two receivers 630A and 630B may be positioned approximately perpendicular to each other. The two receivers 630A and 630B may be at the same offset angle relative to the positioning of the emitter 620.

In the aspect shown in FIG. 6B, the single transducer 625 may select the receiver 630A or the receiver 630B using an electronic switch to receive a reflected wave generated when emitter 620 emits an emitted wave to directed to a focal point on the semiconductor die 610. In this aspect, the position of the receiver 630A and the receiver 630B may also change together with the changing of the position of the emitter 620.

FIGS. 7A to 7D show an exemplary scanning pattern according to various aspects of the present disclosure.

Figure 7A:
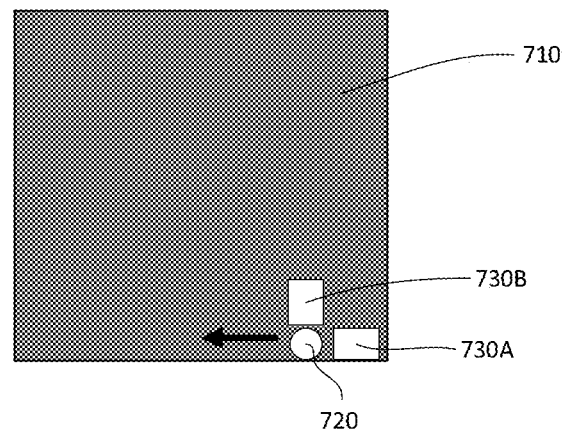
FIGS. 7A to 7D show an exemplary scanning pattern according to various aspects of the present disclosure.

In FIG. 7A, the position of an emitter 720 may change in the direction shown by the arrow. In an aspect, there may be a series of focal points along the surface of a semiconductor die 710. The series of focal points may be on or near the edges of the semiconductor die 710. The emitter 720 may generate a series of emitted waves. The series of emitted waves may act as a series of point sources reflecting the series of emitted waves to generate a series of reflected waves. The position of a receiver 730A may also change along with the position of the emitter 720.

The series of reflected waves received by the receiver may be measured to detect modulations in the amplitude of the series of reflected waves to determine whether there is a defect in the semiconductor die 710. The emitter 720 and the receiver 730A may be an emitter-receiver pair. In order to perform an inspection, the emitter-receiver pair may move linearly along the die edge. In an aspect, the emitter-receiver pair system may be arranged in a parallel fashion to the die edge. Each focal point of the series of focal points may have a spot size range of approximately 20 to 60 microns; for example, the spot size may be 50 microns. Each focal point of the series of focal points may be inspected at each scanning point or step. In an aspect, depending on the location of the focal point, an additional receiver 730B may be used to receive the reflected wave. In another aspect, depending on the location of the focal point, the receiver 730A may be rotated around the emitter 720, while maintaining the angular offset, to receive the additional reflected waves.

In another aspect, a whole semiconductor die may be inspected by moving the emitter-receiver pair along the whole surface of the semiconductor die. The inspection of the whole die may be performed by moving the emitter-receiver pair linearly across from one side edge to another side edge or, alternatively, from a top edge to a bottom edge. The emitter-receiver pair may also be moved along the side or top edge, in a predetermined step, after completing the linear pass through the middle portion of the semiconductor die. This sequence is repeated until the die is completely scanned. The length and width of the semiconductor die are parameters that may be entered in a receiver-emitter controller.

In addition, the four die edges may be inspected by moving the emitter-receiver pair along the edge only. The inspection of the die may be performed one edge at a time, in sequence, by moving the emitter-receiver pair linearly from one corner to another. The starting edge and the edge length for each side are parameters that may be entered in a receiver-emitter controller. Once a preset edge length is traveled, the emitter-receiver pair may proceed to move in a perpendicular direction to scan the following edge, and so on. Scanning a perpendicular die edge may require either a perpendicular rotation of the emitter-receiver pair.

In another aspect, scanning the perpendicular die edges may involve incorporating a second receiver at a perpendicular position with respect to the first receiver. Each receiver may be assigned to a corresponding die edge in such a way that the emitter-receiver pair is parallel to the die edge.

Figure 7B:
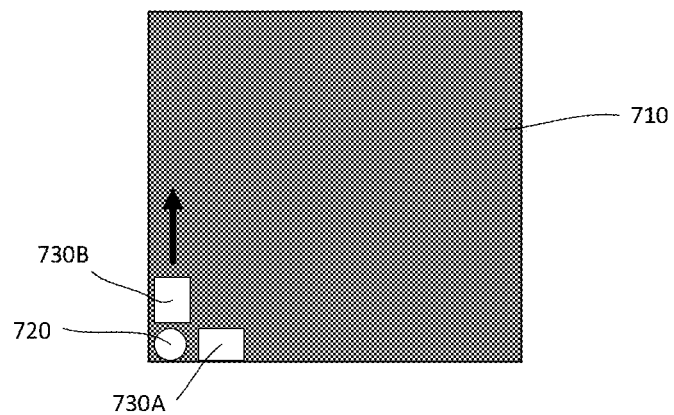

In FIG. 7B, when the emitter 720 and the receivers 730 and 730B move in the direction shown by the arrow, the receiver-emitter controller selects the additional receiver 730B to pair with emitter 720.

Figure 7C:
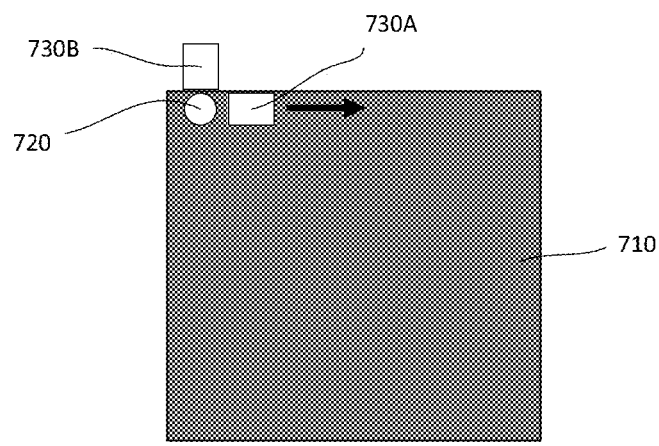

In FIG. 7C, when the emitter 720 and the receivers 730 and 730B move in the direction shown by the arrow, the receiver-emitter controller selects the receiver 730A to pair with emitter 720.

Figure 7D:
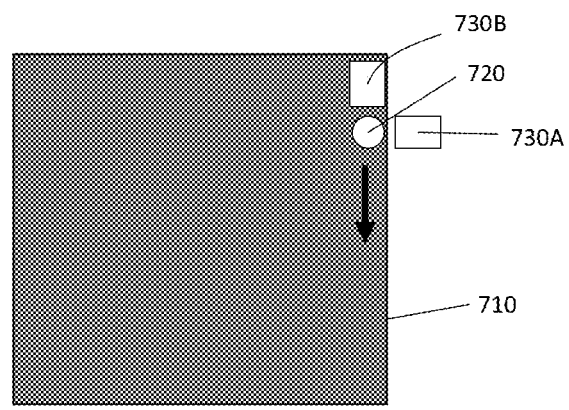

In FIG. 7D, when the emitter 720 and the receivers 730A and 730B move in the direction shown by the arrow, the receiver-emitter controller selects the additional receiver 730B to pair with emitter 720.

Figure 8:
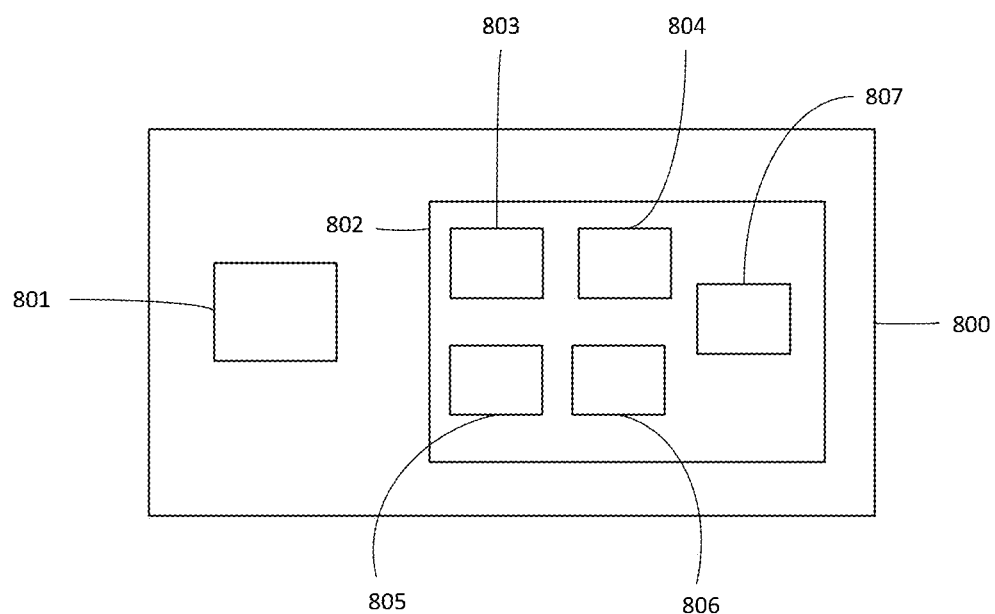
FIG. 8 shows a schematic of a system for detecting defects in a semiconductor die according to aspects of the present disclosure.

FIG. 8 shows a schematic of a system for detecting defects in a semiconductor die according to aspects of the present disclosure.

In an aspect, the system 800 for detecting defects in a semiconductor die may include a selection device 801 for determining the die 810 to be tested for defects. The system 800 may also include a defect detecting device 802 according to the foregoing aspects of the present disclosure.

In an aspect, the defect detecting device 802 may include a die holder 803 for holding a semiconductor dies to be tested. The defect detecting device 802 may include an acoustic emitter 804. The acoustic emitter 804 may be configured to generate emitted waves directed to a focal point on the surface of the die to generate a reflected wave. The focal point may act as a point source reflecting the emitted wave. In the aspect, the defect detecting device 802 may include at least one acoustic receiver 805 to receive the reflected wave that may be paired with the emitter. In addition, the defect detecting device 802 may include an analyzing device 806 for measuring modulations in the amplitude of the reflected waves to identify defects in the die. The defect detecting device 802 may also include a tracking device 807 for monitoring and recording the defects in the die.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

It will be understood that any property described herein for a specific system or device may also hold for any system or device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A device for detecting defects in a semiconductor die comprising:
   an emitter positioned above the die and configured to generate an emitted wave that is directed to a focal point on a surface of the die to generate a reflected wave, wherein the focal point acts as a point source reflecting the emitted wave;
   a receiver paired with the emitter and positioned above the die;

the receiver is positioned set apart from the positioning of the emitter to receive the reflected wave;
wherein the device is configured to measure the reflected wave to detect modulations in an amplitude of the reflected wave;
wherein the emitter is an acoustic element.

2. The device of claim 1, further comprising:
the receiver is positioned at a tilted offset angle relative to the positioning of the emitter to receive the reflected wave;
an additional receiver at a perpendicular position from the receiver and at the same offset angle relative to the positioning of the acoustic emitter, wherein the positions of the emitter, the receiver and additional receiver are movable to scan different surfaces of the die; and
an electronic switch for selecting the receiver or the additional receiver.

3. The device of claim 1, wherein the emitter and the receiver are acoustic elements.

4. The device of claim 1, wherein emitter is an acoustic element and the receiver is a vibration sensor positioned at a receiving angle that is perpendicular to a top surface of the die.

5. The device of claim 4, further comprising:
an additional receiver at a perpendicular position from the receiver, the additional receiver is a second vibration sensor positioned at a receiving angle that is perpendicular to the top surface of the die, wherein the positions of the emitter, the receiver, and additional receiver are movable to scan different surfaces of the die.

6. A system for detecting defects in a semiconductor die comprising:
a selection device for determining the die to be tested for defects;
a defect detecting device comprising:
a die holder;
an acoustic emitter configured to generate emitted waves directed to a focal point on the surface of the die to generate a reflected wave, wherein the focal point acts as a point source reflecting the emitted wave; and
at least one acoustic receiver to receive the reflected wave that is paired with the emitter;
an analyzing device for measuring modulations in an amplitude of the reflected waves to identify defects in the die; and
a tracking device for monitoring and recording the defects in the die.

7. The system of claim 6, further comprising:
an additional acoustic receiver configured to be positioned at a perpendicular position from the acoustic receiver; and
an electronic switch for selecting the acoustic receiver or the additional acoustic receiver.

8. The system of claim 6, wherein positions of the acoustic emitter and the acoustic receiver are movable to scan different surfaces of the die.

9. A method for non-destructive detection of defects in a semiconductor die comprising:
positioning an emitter above the die;
generating an emitted wave using the emitter that is directed to a focal point on a surface of the die;
generating a reflected wave from the focal point, wherein the focal point acts as a point source reflecting the emitted wave;
positioning a receiver above the die to receive the reflected wave; and
measuring the reflected wave to detect modulations in an amplitude of the reflected wave;
wherein the receiver is positioned set apart from and tilted at an angle offset relative to the positioning of the emitter to receive the reflected wave;
further comprising:
changing the positioning of the emitter and generating additional emitted waves;
wherein the focal point further comprises:
a series of focal points along the surface of the die;
generating additional reflected waves from the series of focal points; and
measuring the additional reflected waves to detect modulations in the amplitude of the additional reflected waves.

10. The method of claim 9, wherein the emitted wave is directed to the focal point at a specified angle of incidence of approximately 90 degrees.

11. The method of claim 9, further comprising:
a changing of the positioning of the receiver together with the changing of the positioning of the emitter; and
a further changing by rotating the receiver around the emitter, while maintaining the angular offset, to receive the additional reflected waves.

12. The method of claim 9, further comprising:
positioning an additional receiver at a perpendicular position from the receiver and at the same offset angle relative to the positioning of the acoustic emitter; and
selecting the acoustic receiver or the additional receiver using an electronic switch.

13. The method of claim 12, further comprising:
a changing of the positioning of the receiver and the additional receiver together with the changing of the positioning of the emitter.

14. The method of claim 9, wherein the emitter and the receiver are acoustic elements.

15. The method of claim 14, further comprising:
immersing the die and at least a portion of the emitter and at least a portion of the receiver in a liquid medium.

16. The method of claim 14, further comprising the emitter having a frequency range of approximately 50 kHz and 200 MHz.

17. The method of claim 9, wherein the receiver is a vibration probe that is positioned perpendicular to a top surface of the die.

18. The method of claim 9, further comprising:
the die having a thickness range of approximately 50 um to 800 um and having a backside metallization layer with a thickness range of approximately 0.5 um to 1 um.

* * * * *